United States Patent
Pfeffer et al.

(10) Patent No.: US 10,321,534 B1
(45) Date of Patent: Jun. 11, 2019

(54) COLOR ERROR CORRECTED SEGMENTED LED ARRAY

(71) Applicant: Lumileds LLC, San Jose, CA (US)

(72) Inventors: Nicola Bettina Pfeffer, Eindhoven (NL); Arjen Gerben Van Der Sijde, Eindhoven (NL); Brendan Moran, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/819,413

(22) Filed: Nov. 21, 2017

(51) Int. Cl.
| | |
|---|---|
| *H05B 33/08* | (2006.01) |
| *H05B 37/02* | (2006.01) |
| *G03B 15/05* | (2006.01) |
| *H01L 27/15* | (2006.01) |
| *H01L 33/50* | (2010.01) |

(52) U.S. Cl.
CPC ..... *H05B 33/0866* (2013.01); *H05B 33/0851* (2013.01); *H05B 33/0854* (2013.01); *H05B 33/0863* (2013.01); *H05B 37/0218* (2013.01); *G03B 15/05* (2013.01); *H01L 27/153* (2013.01); *H01L 27/156* (2013.01); *H01L 33/507* (2013.01)

(58) Field of Classification Search
CPC ...................... H05B 33/0815; H05B 33/0845; H05B 41/36; Y02B 20/40
See application file for complete search history.

(56) References Cited

U.S. PATENT DOCUMENTS

| | | | |
|---|---|---|---|
| 6,379,022 B1 * | 4/2002 | Amerson | H05B 33/0863 362/1 |
| 7,520,634 B2 * | 4/2009 | Ducharme | H05B 33/0857 362/231 |
| 8,817,128 B2 | 8/2014 | Spielberg | |
| 2004/0264193 A1 * | 12/2004 | Okumura | F21S 10/02 362/276 |
| 2005/0168965 A1 | 8/2005 | Yoshida | |
| 2007/0201853 A1 | 8/2007 | Petschnigg | |
| 2013/0285553 A1 | 10/2013 | Shimomura et al. | |

FOREIGN PATENT DOCUMENTS

| | | |
|---|---|---|
| CN | 204810595 U | 11/2015 |
| WO | 2017/080875 | 5/2017 |

* cited by examiner

*Primary Examiner* — Douglas W Owens
*Assistant Examiner* — Jianzi Chen
(74) *Attorney, Agent, or Firm* — Schwegman Lundberg & Woessner, P.A.

(57) ABSTRACT

A method of color error correction for a segmented LED array is disclosed. The method includes calculating a target luminance for LED segments in a segmented LED array based on an initial luminance pattern, determining a luminance ratio based on the target luminance, the luminance ratio defined as a ratio of a primary luminance value of the primary LED segment to a secondary luminance value of the at least one adjacent LED segment, and comparing the luminance ratio to a predefined threshold ratio. If the luminance ratio is greater than or equal to the predefined ratio, then the secondary luminance value of the at least one adjacent LED segment is maintained. If the luminance ratio is less than the predefined ratio, then the secondary luminance value of the at least one adjacent LED segment is increased.

9 Claims, 7 Drawing Sheets

COLOR ERROR CORRECTED SEGMENTED LED ARRAY

FIELD OF INVENTION

The present invention generally relates to light emitting diodes (LEDs), and more particularly relates to color error correction for an array of LEDs.

BACKGROUND

In photography, camera flashes from an LED array can cause undesirable color temperature disruptions. Conventional camera flash systems with color adjustable flash units are known. For example, U.S. Pat. No. 8,817,128, which is incorporated by reference, discloses adjusting illumination for controlling color temperature in a camera flash system. Data that corresponds to the ambient light of a physical environment is collected, such as by a color temperature meter included in the camera. The ambient light has a distribution of color temperatures that cycle over a fixed time period. When a flash request is received, a time cycle is calculated to determine when the flash unit will flash. A color temperature is identified from a distribution of color temperatures, and a color temperature is predicted for ambient light that is present in the physical environment when the flash unit flashes. The color temperature of the flash unit is then set to the identified color temperature.

Color temperature selection for an array of LEDs is also known. For example, U.S. Pub. 2005/0168965, which is incorporated by reference, describes an array of LEDs used in a flash device. In this disclosure, light flashes towards a subject in a photographic scene using an LED matrix array, such that individual lighting fields differ from one another. A selective excitation circuit is used for selectively illuminating the LEDs so as to produce a projected flash light, which differs in intensity.

Segmented LED arrays with adaptive flash features are also known. These LED arrays allow flash systems to illuminate a scene more homogenously, without uneven bright and dark regions. Adaptive flash LEDs can be used to avoid overexposure by selective dimming and/or enhancing of certain LED segments within the LED array. To ensure satisfactory contrast in a scene illumination, optics can effectively image the LED array onto a selected scene. However, for white LEDs, color variations still exist due to local over-conversion of light. This over-conversion can produce yellow light due to locally thicker phosphor layers in the LED array. In segmented LEDs, during selective illumination a single LED of the LED array is illuminated while a directly adjacent or neighboring LED is not illuminated. In monolithic matrix LED arrays, a sapphire or phosphor layer covers the active light emission sites as a single piece or layer. This arrangement leads to light deflecting inside the matrix blocks. Due to different extraction efficiencies (i.e. how much blue or phosphor converted light is projected from the LED), a single illuminated LED segment may generally cause a yellow rim in adjacent switched off LED segments.

It would be desirable to provide an LED array that reduces or eliminates the undesirable color error in an LED array.

SUMMARY

Briefly stated, an improved LED array system is provided that selectively illuminates neighboring LED segments surrounding a primary illuminated LED segment to effectively reduce color errors that otherwise occur in closely packed LED arrays.

In one embodiment, a method for correcting color errors in an LED array system is provided that selectively illuminates neighboring LED segments around a primary illuminated LED segment. Selective illumination of neighboring LED segments around a primary illuminated LED segment corrects color errors that are otherwise introduced by the neighboring LED segments due to over-converted light and leaked light within the LED array.

Illumination of the neighboring LED segments is relatively low. For example, in one embodiment the illumination of the neighboring LED segments is less than 10% of the illumination of the primary illuminated LED segment, such that contrast between the LED segments is not diminished or negatively impacted. The illumination level of the neighboring LED segments is calibrated based on physical characteristics of the LED array, such as die structure, layer thickness, layer composition, etc.

BRIEF DESCRIPTION OF THE DRAWINGS

The foregoing Summary as well as the following Detailed Description will be best understood when read in conjunction with the appended drawings. In the drawings.

DETAILED DESCRIPTION OF THE PREFERRED EMBODIMENTS

It is to be understood that the figures and descriptions for an LED array system and method of correcting color error for an LED array system have been simplified to illustrate elements that are relevant for a clear understanding, while eliminating, for the purpose of clarity, many other elements found in typical electronics packaging. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Figure 1:
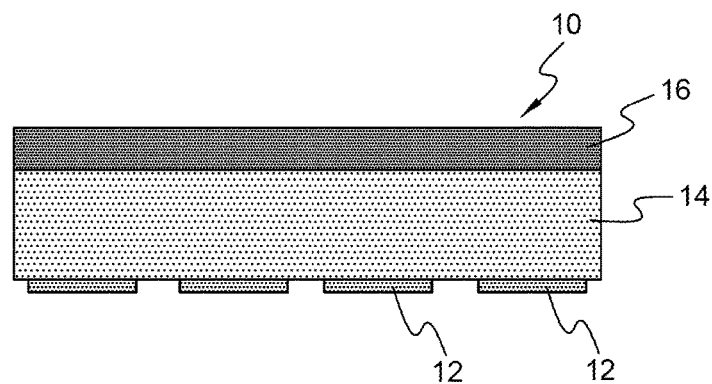
FIG. 1 is a side view of a segmented LED array.
Figure 2:
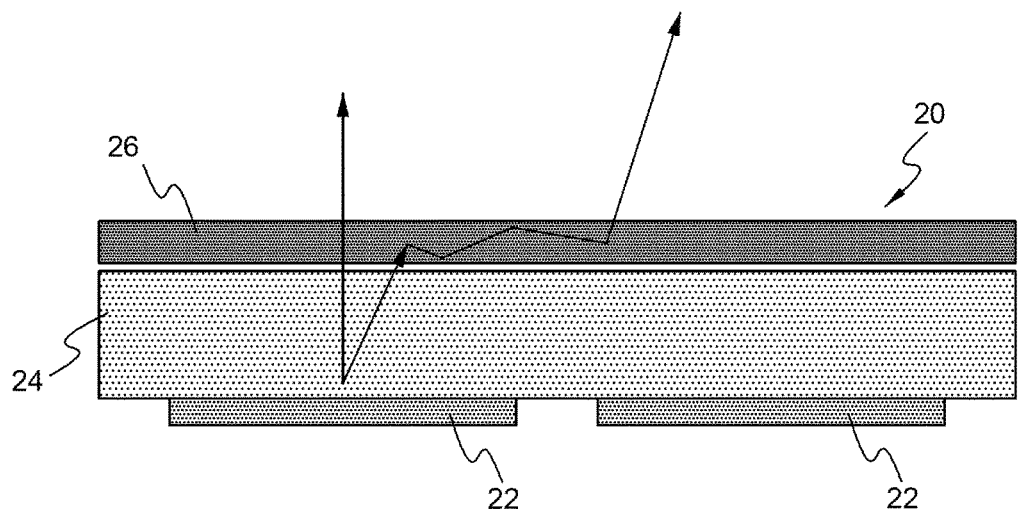
FIG. 2 is a side view of a segmented LED array with a specific LED segment illuminated.
Figure 3:
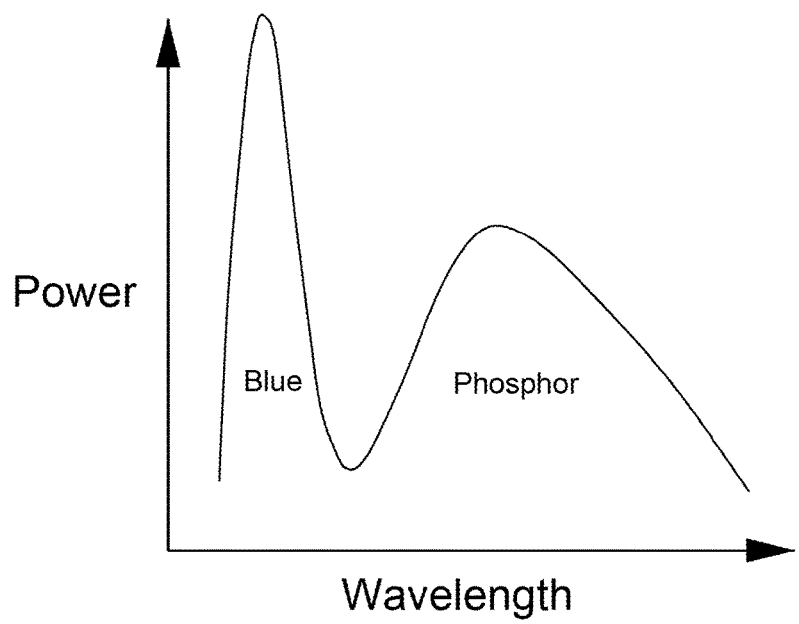
FIG. 3 is a graph of power versus wavelength for a typical LED array.

FIGS. 1 and 2 illustrate LED arrays 10, 20 including a die layer 12, 22, a sapphire layer 14, 24, and a phosphor layer 16, 26. One of ordinary skill in the art would recognize that alternative materials for the LED array 10, 20 can be used. As shown schematically in FIG. 2, blue light (indicated by the two arrow lines traveling in a straight path) does not propagate very far in the phosphor layer 26 since the probability to be converted in the phosphor increases with the traveled path length. However, phosphor converted light can propagate in the phosphor layer 26, as shown schematically in FIG. 2 by the multiple angled lines, which can cause undesirable color errors. Differences in the propagation characteristics of the layers result in a color variation over the LED array 10, 20. Characteristics of the LED array 10, 20, such as thickness of the sapphire layer 14, 24, thickness of the phosphor layer 16, 26, adding layers to the LED array 10, 20, phosphor concentration, and other characteristics result in varying luminance and color characteristics for the LED arrays 10, 20. Due to these variations, LED arrays experience undesirable color errors and variations, resulting in color shading in a photographed scene. FIG. 3 is a graph showing exemplary characteristics of emitted spectral power density versus wavelength for a white LED, and shows the respective locations of the blue die (i.e. pump) and the yellowish spectrum of the phosphor converted light.

Figure 4:
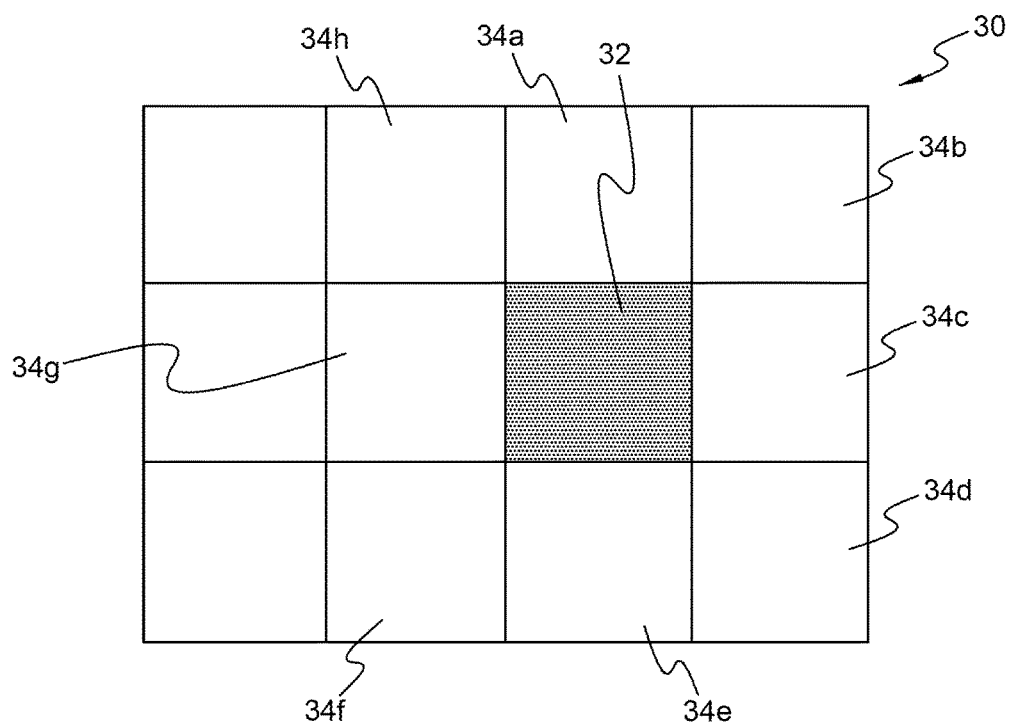
FIG. 4 is a top view of a segmented LED array with a single LED segment illuminated.

FIG. 4 illustrates one type of luminance pattern for an LED array 30. This luminance pattern corresponds to one type of adaptive flash. Adaptive flash selectively illuminates only those portions of the scene which need more illuminance compared to other areas which are sufficiently illuminated by ambient light. One such adaptive flash configuration is disclosed in WO 2017/080875, which is incorporated by reference as if fully set forth herein.

One of the ways to realize adaptive flash is to use an LED array under a common lens. Segments of the LED array can be selectively switched on and will illuminate only a correlated part of the scene. In this luminance pattern, a primary LED segment 32 is illuminated, while all of the neighboring secondary LED segments 34a-34h are not illuminated. In this luminance pattern, leaked light has a higher probability of causing an undesirable halo or rim effect around the single primary LED segment 32.

Figure 5:
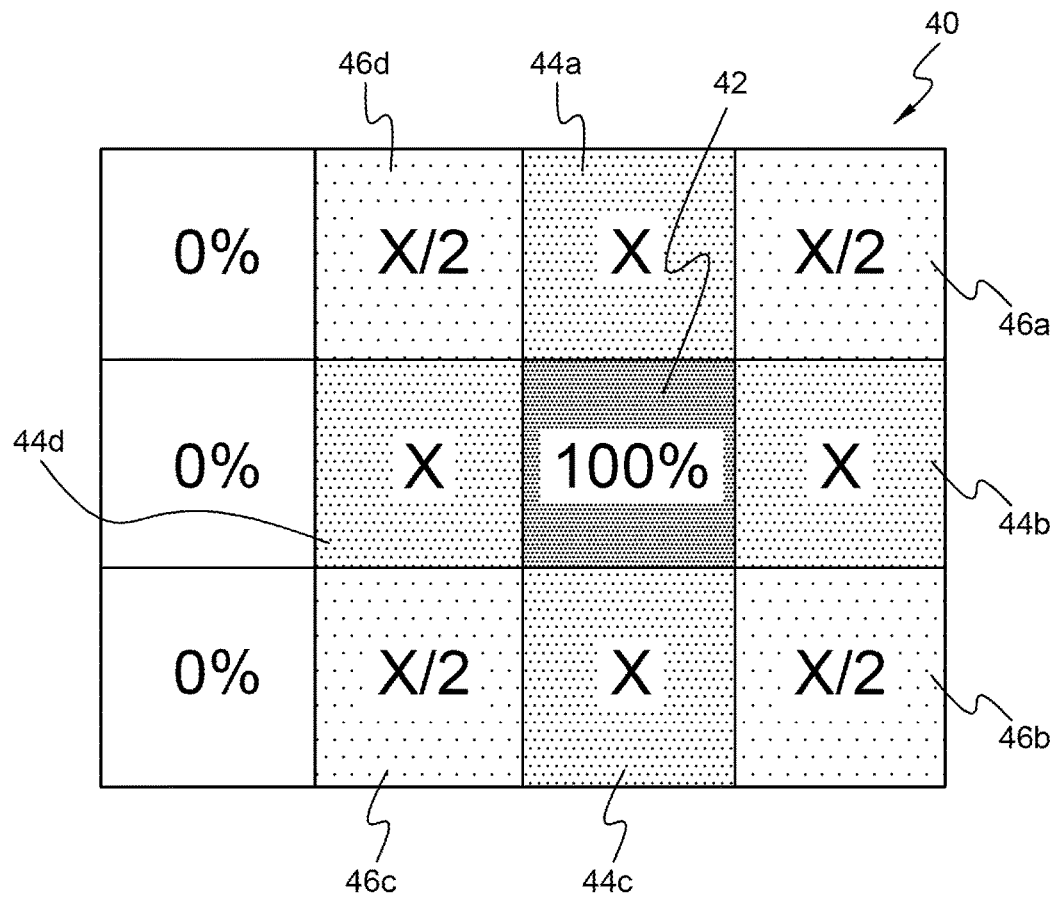
FIG. 5 is a top view of a segmented LED array with a primary LED segment illuminated and neighboring LED segments selectively illuminated according to one embodiment.

FIG. 5 illustrates an embodiment of an LED array 40. As shown in FIG. 5, a primary LED segment 42 is illuminated. In this mode, directly adjacent secondary LED segments 44a-44d are also illuminated, but to a much lower degree than the primary LED segment 42. As used herein, the term directly adjacent secondary LED segment refers to an LED segment that shares an entire sidewall with the primary LED segment. In a preferred embodiment, the directly adjacent secondary LED segments 44a-44d are illuminated at an illumination intensity "X." This illumination intensity is determined based on a compromise of color variation and contrast.

In this embodiment, diagonally adjacent secondary LED segments 46a-46d are illuminated to a lower level than the directly adjacent secondary LED segments 44a-44d. As used herein, the term diagonally adjacent secondary LED segment refers to an LED segment that only contacts the primary LED segment at a point or a corner. In one embodiment, the diagonally adjacent secondary LED segments 46a-46d are illuminated to an illumination intensity "X/2", i.e. half of the intensity level of the directly adjacent secondary LED segments 44a-44d. One of ordinary skill in the art would recognize from the present application that the intensity level of the diagonally adjacent secondary LED segments 46a-46d can be more or less than X/2. For example, in one embodiment, the luminance value of the at least one diagonally adjacent LED segment is between 40-60% of the luminance value of the at least one directly adjacent LED segment.

Although there is only a single primary LED segment illuminated in FIG. 5, one of ordinary skill in the art would recognize that the concept of selective relatively low illumination of neighboring LED segments can be used in a variety of illumination profiles. For example, there can be multiple primary LED segments, each including adjacent secondary LED segments with relatively low-level illumination intensities.

Figure 6:
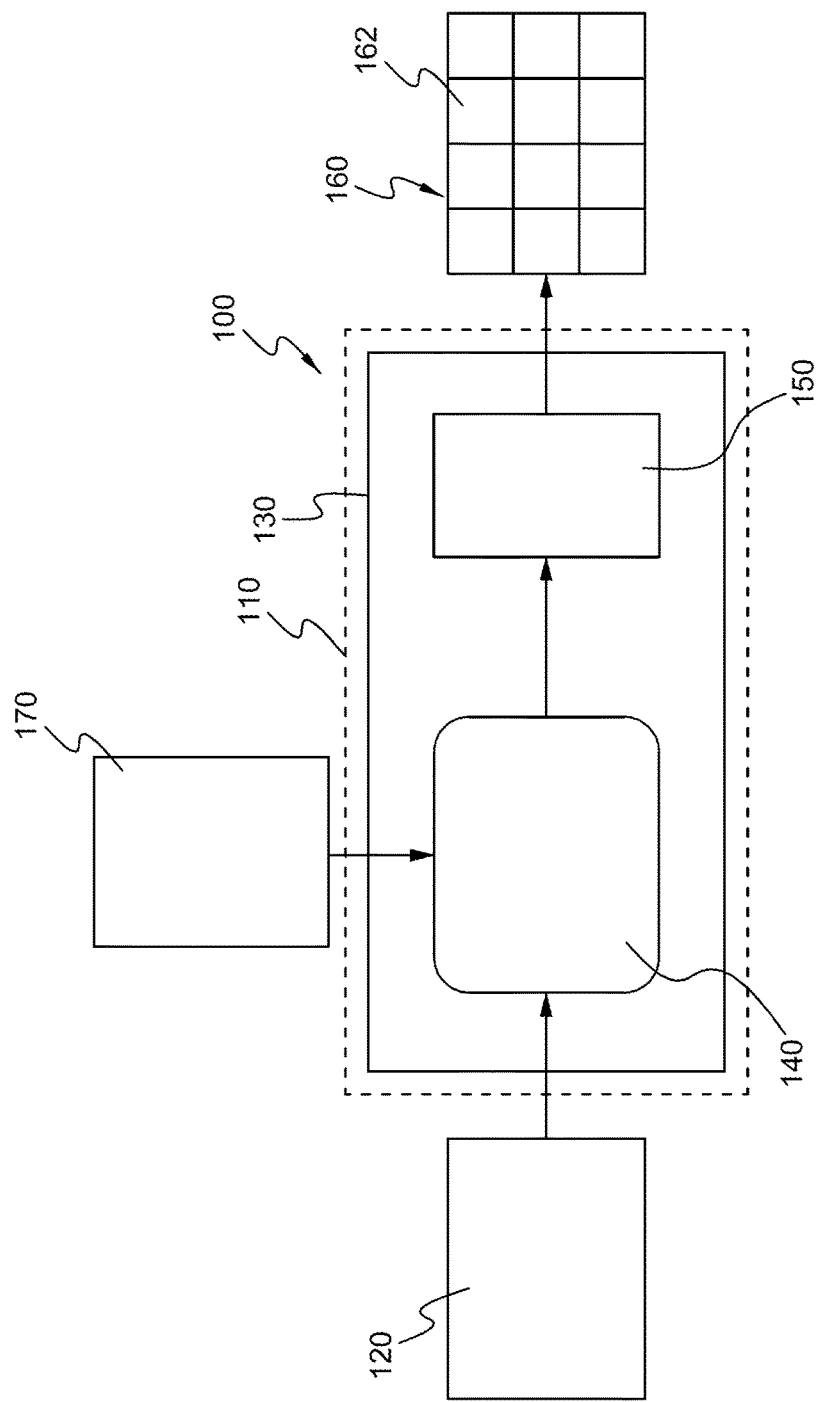
FIG. 6 is a schematic drawing of an LED array system according to one embodiment.

FIG. 6 illustrates a system 100 for color error correction of an LED array. The system 100 includes a digital image capture device 110. One of ordinary skill in the art would recognize from the present disclosure that the digital image capture device 110 can be a smartphone camera, a video camera, a compact camera, a digital single lens reflex ("dSLR") camera, or any other type of image capturing device.

In one embodiment, the device 110 includes a sensor 120, a CPU 130, and an LED array 160. In one embodiment, the sensor 120 is a user interface. In one embodiment, sensor 120 also includes a keyboard or a touchscreen. A user can select a specific setting for adaptive lighting by selecting a mode on a user interface. In an alternative embodiment, the sensor 120 can include any type of optical sensor as understood by those of ordinary skill in the art. In one embodiment, the sensor 120 can convert optical images into electrical signals representative of an intensity and luminance of ambient light captured by the sensor 120. The sensor 120 can provide these signals to the CPU 130 for further processing and analysis.

The LED array 160 can include any of the features described above with respect to LED arrays. Although the LED array 160 is illustrated as a 3x4 array in FIG. 6, one of ordinary skill in the art would recognize from the present disclosure that the size and configuration of the LED array 160 can be varied.

The CPU 130 preferably includes a processor 140 and a driver 150. The processor 140 may be, for example and without limitation, a microprocessor or a plurality of microprocessors, a single-core or multi-core processor, a general purpose processor, a special purpose processor, a conventional processor, a Graphics Processing Unit (GPU), a digital signal processor (DSP), one or more microprocessors associated with a DSP core, a controller, a microcontroller, or any other any unit, module, or machine capable of executing a sequence of instructions. The driver 150 can include any known selective excitation/illumination elements, such as a selective excitation circuit, excitation control circuit, power supply circuit, and input/output circuit disclosed in U.S. Pub. 2005/0168965, and specifically illustrated in FIG. 2 of U.S. Pub. 2005/0168965, which is incorporated by reference as if fully set forth herein. The driver 150 is configured to provide varying input signals to the LED array 160 to illuminate specific LED segments 162 of the LED array 160. The driver 150 is also configured to provide varying input signals to the LED array 160 regarding the illumination values of the specific LED segments 162 of the LED array 160. Varying luminance patterns can be stored in the CPU 130 via a memory unit or other data storage unit.

The sensor 120 is configured to detect a brightness profile and optical characteristics of a scene. The brightness profile is representative of relative incident light in a specific scene. The CPU 130 receives input from the sensor 120 regarding the brightness profile and characteristics of the scene. The CPU 130 performs image processing and algorithms on the input received from the sensor 120 regarding the brightness profile of the scene. Based on this information, the CPU 130 calculates a target luminance for LED segments 162 in the LED array 160.

Figure 8:
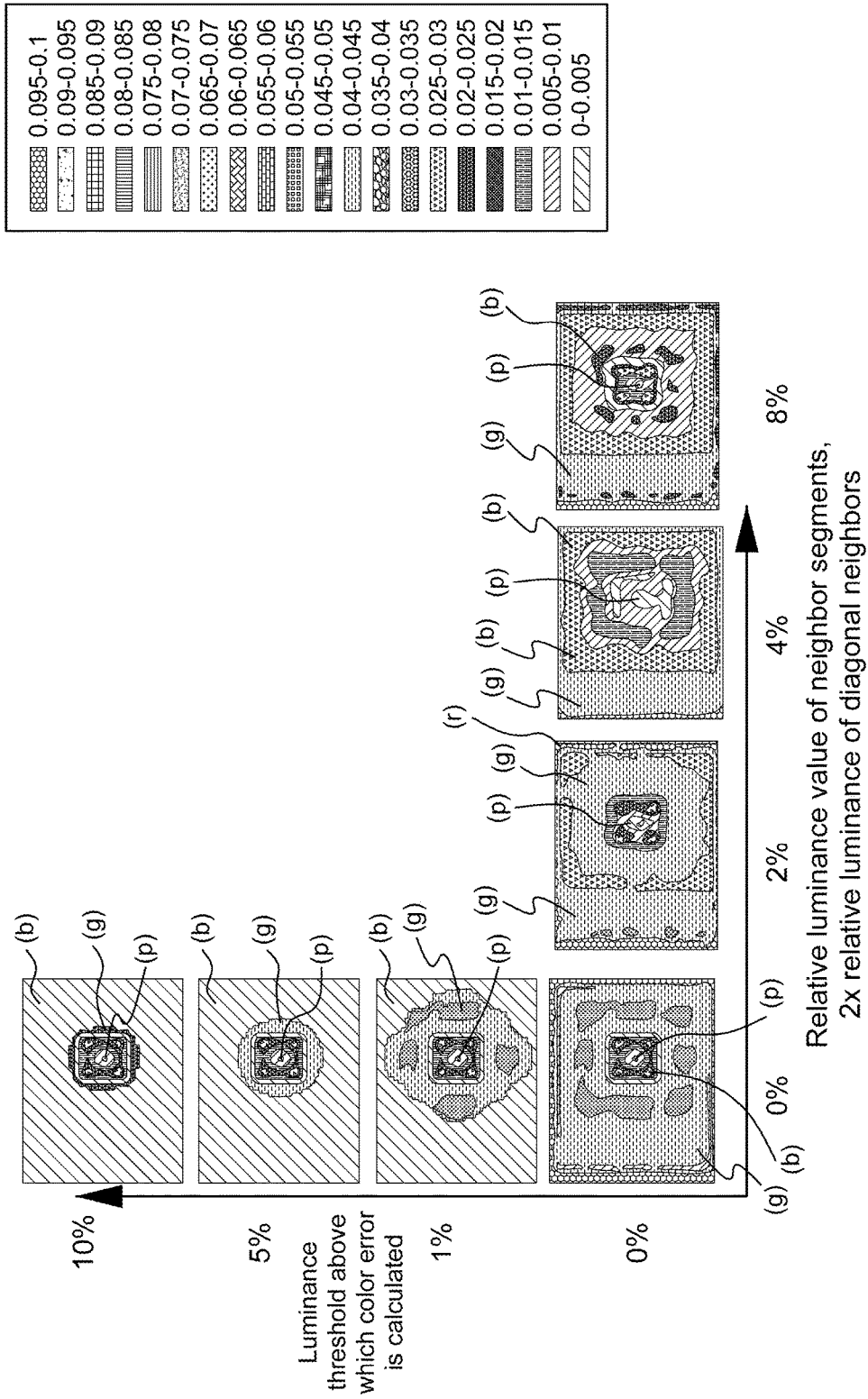
FIG. 8 is a graph showing a luminance threshold versus a relative luminance value for an LED array.
Figure 9:
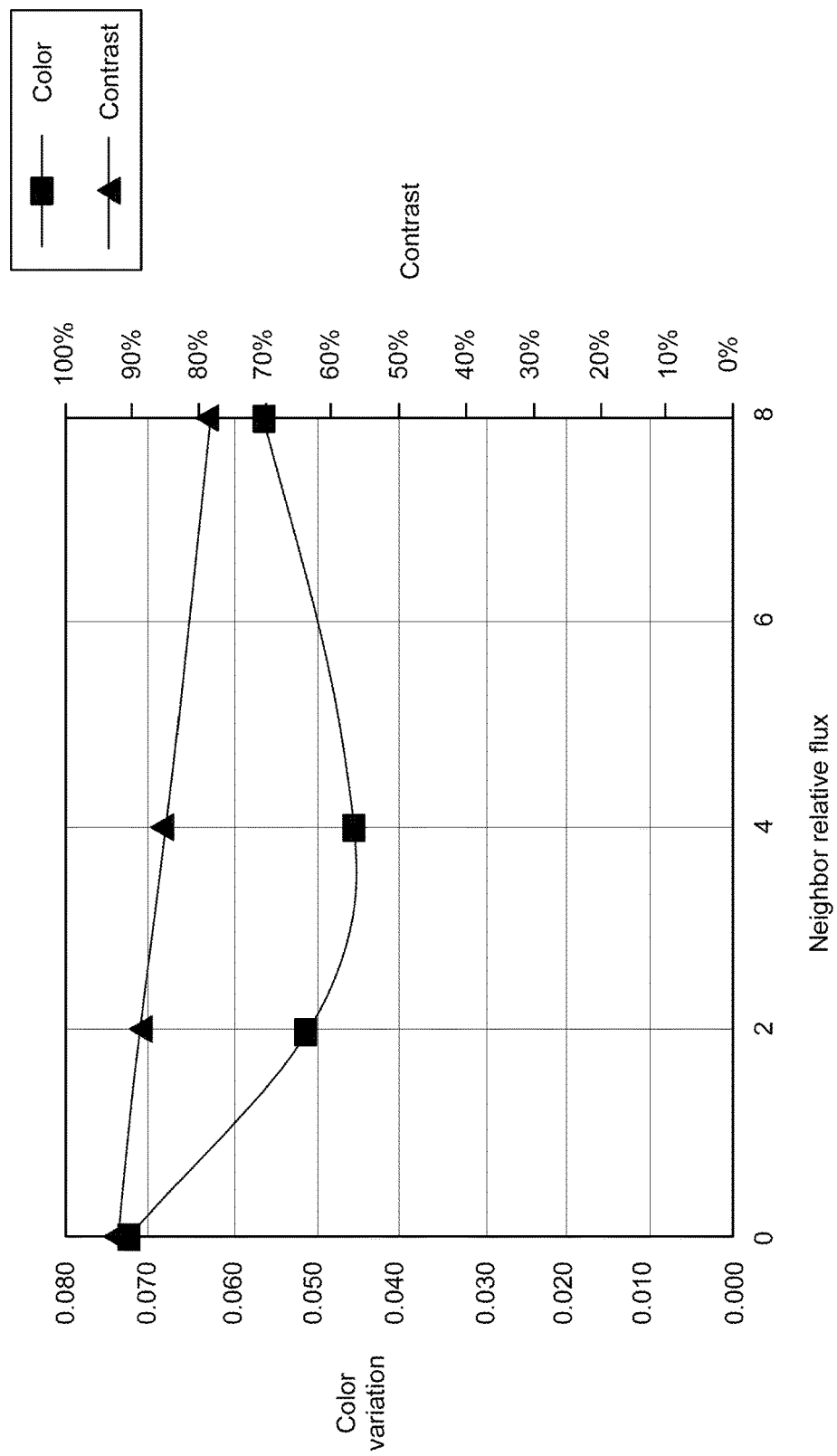
FIG. 9 is a graph showing color variation and contrast at varying neighbor relative flux values.

The CPU 130 is also provided with a predefined threshold ratio. The predefined threshold ratio is defined by a relative luminance of a single LED segment in an LED array compared to a luminance of an adjacent LED segment. The predefined threshold ratio is selected based on testing and data for a wide range of LED arrays. The predefined threshold ratio is selected to minimize color errors. FIGS. 8 and 9, which are discussed in more detail below, provide optical simulation data regarding determining an optimal predefined threshold ratio. According to one embodiment, the predefined threshold ratio is at least 3% and less than 5%. In a more preferred embodiment, the predefined threshold ratio is 4%.

The CPU 130 is provided with a predefined threshold ratio and uses this predefined threshold ratio to determine if particular LED segments 162 in the LED array 160 should be illuminated based on a comparison of a detected brightness profile to the predefined threshold ratio. The CPU 130 regulates a current provided to each individual LED segment 162 in the LED array 160. The driver 150 provides an input signal to the LED array 160 regarding which LED segments 162 are illuminated and the relative luminosity of each of the LED segments 162 in the LED array 160.

In one embodiment, the CPU 130 is provided with the predefined threshold ratio from an external source, i.e. a source that is external from the device 110. For example, in one embodiment, a plurality of the CPUs are programmed during manufacturing after a specific type of LED array that is representative of a plurality of LED arrays has been tested and calibrated. Characteristics of the plurality of LED arrays are stored in a memory connected to a respective one of the plurality of CPUs. Characteristics for the LED array can be experimentally determined, and then stored in memory, such that they can be utilized by the CPUs to cause the LED array to be driven with a specific predefined threshold ratio based on the characteristics of that specific LED array.

An input device 170 can encode or program the device 110 with a specific predefined threshold ratio. In one embodiment, the predefined threshold ratio is unique to a specific LED array, a specific model of LED array, a specific lot of LED arrays, or other class or subset of LED arrays. One of ordinary skill in the art would recognize that the characteristics of an LED array are dependent upon die structure, thickness and content of layers within the LED array, and other factors. One of ordinary skill in the art would also recognize that optics and an acceptable color error in a scene may vary threshold ratios. During assembly of a plurality of the devices 110, a single predefined threshold ratio can be selected for a plurality of LED arrays 160 that are being installed into a respective one of the plurality of the devices 110. The input device 170 can then program or encode a respective one of the CPUs 130 in the devices 110 with the predefined threshold ratio.

In another embodiment, the device 110 can dynamically determine the predefined threshold ratio. In one embodiment, the CPU 130 is provided with an integrated input device 170 that is configured to determine the predefined threshold ratio. The input device 170 in this embodiment determines the predefined threshold ratio in situ, i.e. while a user is operating the device 110. In one embodiment, an algorithm determines color error experienced by each LED segment and iteratively adds intensity for neighboring LED segments. After the color error is low enough according to a predetermined target, then the threshold is determined. This algorithm can be provided to users of multiple devices or could be implemented during manufacturing of the devices.

In one embodiment, the dynamic determination of the predefined threshold ratio requires determining a color error experience by each LED segment in an LED array, and iteratively toggling turning on neighboring LED segments. Once the color error is low enough, then the threshold is known. This algorithm can be given to the user of the devices 110, or could be performed as factory calibration.

A predefined luminance threshold can be tested for a specific LED array to determine an acceptable color error. FIG. 8 illustrates the color error for an illumination provided by a specific LED array with a primary LED segment (p) being illuminated, as well as the color error for an illumination with neighboring LED segments illuminated. As shown in FIG. 8 in false color plots, a relatively acceptable color error is indicated by a blue (b) region, while a moderately acceptable color error is indicated by a green (g), and unacceptable color error is indicated by a red (r) region. The legend in FIG. 8 generally indicates red for color error with values 0.095-0.1, orange for color error with values 0.085-0.09, yellow for color error with values 0.075-0.08, light green for color error with values 0.055-0.06, green for color errors with values 0.04-0.045, turquoise for error values 0.025-0.03, light blue for color error with values 0.015-0.02, blue for color error with values 0.01-0.015, and dark blue for color errors with values 0-0.005. Intermediate shades of the colors are represented in the values not explicitly identified herein. Several metrics can be used to define color errors. One such metric applied here is the color difference in u', v' space. In one embodiment, the color difference can be defined by the following calculation: sqrt(($u'-u'_{reference}$)$^2$+($v'-v'_{reference}$)$^2$) wherein u', v' are the color coordinates over the source in the color space (L*, u*, v*), and $u'_{reference}$ and $v'_{reference}$ are the targeted color point. These values are understood by those of ordinary skill in the art, as explained by the International Commission on Illumination (CIE).

As shown in FIG. 8, for the 0% luminance threshold and 0% relative luminance value of neighbor segments, a majority of the image is green (g), while an outer edge of the plot is red (r), and the primary LED segment (p) is blue (b). As the luminance threshold is increased on the Y-axis to 1%, the relative size of the green (g) area decreases, and a larger portion of the plot is blue (b). As the luminance threshold is increased to 5%, the majority of the plot is blue (b), and a smaller halo of green (g) remains around the primary LED segment (p). Finally, as the luminance threshold is increased to 10%, there is only a small green (g) halo forming a band around the primary LED segment (p), and the vast majority of the plot is blue (b). This Figure shows that the highest color errors are only present for small luminance in this case, but still present and visible for the attentive observer (i.e. the green area at the 0% luminance threshold). The present disclosure neutralizes the color error by switching on the neighboring segment with low current. This effect is shown by the results along the X-axis. As the relative luminance value of neighbor segments is increased to 2%, a patch of green (g) is remains on the left side of the image, while a green (g) circle around the primary LED segment (p) includes some blue (b) portions around its periphery. At a relative luminance of 4%, the green (g) band on the left hand side of the image remains, but the green (g) circle around the primary LED segment (p) disappears, and a majority of the area surrounding the primary LED segment (p) is blue (b). Finally, at 8% relative luminance the green (g) band remains on the left side of the image and the blue (b) around the primary LED segment (p) has turned from a light blue to a light blue-green. As shown by FIG. 8, the 4% relative luminance has the lowest overall color error. The relative values of the luminance can be varied based on the data from the graph in FIG. 8. One of ordinary skill in the art recognizes that this graph is for one type of LED array with a specific luminance pattern. Alternative graphs can be generated for other types of LED arrays and luminance patterns, which will vary based on characteristics of the LED array structure.

FIG. 9 illustrates a graph of the color variation and contrast of an image based on a varying neighbor relative flux value. The neighbor relative flux value corresponds to luminance ratio as used herein. Neighbor relative flux compares the luminance value of one LED segment of an LED array versus the luminance value of a second neighboring LED segment of the LED array. As shown in FIG. 9, at 0% neighbor relative flux, the color variation is between 0.072-0.075 and the contrast is around 92%-94%. As the neighbor relative flux increases to 2%, the color variation drops to around 0.050-0.052, and the contrast drops to around 88%. When the neighbor relative flux increases to 4%, the color variation continues to drop, but at a lower rate to around 0.045-0.047, and the contrast steadily decreases to around 85%. When the neighbor flux increases to 6%, the color variation begins to increase to around 0.048-0.050 and the contrast decreases to around 81%. Finally, at 8% neighbor relative flux, the color variation increases to around 0.056-0.058 and the contrast decreases to around 77%-78%. As shown by FIG. 9, while the color error is reduced by powering the neighbor segments, the contrast decreases. As shown in FIG. 8, the color error shows a minimum at 4%, while the contrast ratio decreases continuously. Depending on the specific weight factor that a particular application assigns to the contrast ratio or color error, the best relative flux for the neighbors can be chosen.

Figure 7:
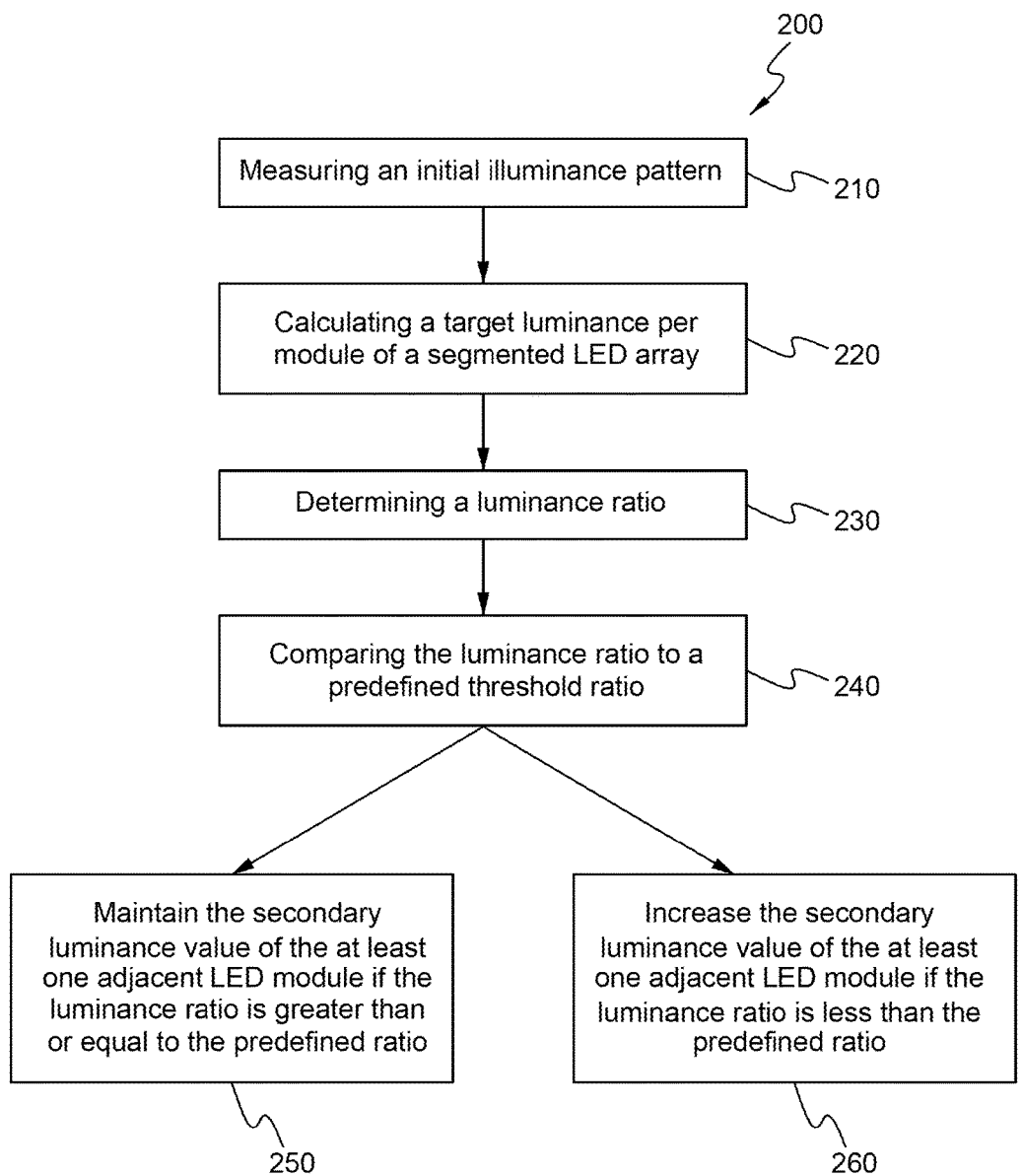
FIG. 7 is a flow chart of a method for color error correction for a segmented LED array according to one embodiment.

In one embodiment, referring to FIG. 7, a method 200 of color error correction for a segmented LED array is provided. According to the method 200, an initial illuminance pattern is measured or captured 210. This step generally requires taking a photo. The photo then is used as a brightness profile of a scene. Areas within the scene with brightness levels below the targeted brightness of the picture are filled in by the adaptive flash brightness profile. In one embodiment, this profile may be the inverse of the existing picture brightness (i.e. to the extent possible based on the available flux from the flash). Next, a target luminance per LED segment of a segmented LED array is calculated 220, which corresponds to the aforementioned target brightness profile in the scene to be generated. This value is determined according to an adaptive flash algorithm, as described herein.

The method 200 includes determining a luminance ratio 230 between adjacent LED segments of the segmented LED array. The luminance ratio is defined as a ratio of a primary luminance value of the primary LED segment compared to a secondary luminance value of the at least one adjacent LED segment. The method 200 includes comparing the luminance ratio to a predefined threshold ratio 240. Based on the outcome of this comparison, the luminance of the at least one adjacent LED segment is either maintained 250 or changed 260. In a preferred embodiment, the luminance of the at least one adjacent LED segment is either maintained or increased. If the luminance ratio is greater than or equal to the predefined ratio, then the secondary luminance value of the at least one adjacent LED segment is maintained 250. If the luminance ratio is less than the predefined ratio, then the secondary luminance value of the at least one adjacent LED segment is increased 260. In one embodiment, the secondary luminance value of the at least one adjacent LED segment is increased until the luminance ratio equals the predefined threshold ratio.

The non-limiting methods and embodiments described herein for an LED array system and a method of correcting color error for an LED array system may be modified for a variety of applications and uses while remaining within the spirit and scope of the claims. The implementations and variations described herein, and/or shown in the drawings, are presented by way of example only and are not limiting as to the scope and spirit. The descriptions herein may be applicable to all implementations of the method and system described herein although it may be described with respect to a particular implementation.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the method for using sputtering deposition to grow layers in light emitting devices described herein, and are considered to be within the full scope of the invention.

Some features of some implementations may be omitted or implemented with other implementations. The device elements and method elements described herein may be interchangeable and used in or omitted from any of the examples or implementations described herein.

Although features and elements are described above in particular combinations, each feature or element can be used alone without the other features and elements or in various combinations with or without other features and elements.

What is claimed is:

1. A method of color error correction for a segmented LED array, the method comprising:
   (a) calculating a target luminance for LED segments in a segmented LED array based on an initial luminance pattern;
   (b) determining a luminance ratio based on the target luminance, the luminance ratio defined as a ratio of a primary luminance value of the primary LED segment to a secondary luminance value of the at least one adjacent LED segment;
   (c) comparing the luminance ratio to a predefined threshold ratio, and
      (i) if the luminance ratio is greater than or equal to the predefined ratio, then the secondary luminance value of the at least one adjacent LED segment is maintained, or
      (ii) if the luminance ratio is less than the predefined ratio, then the secondary luminance value of the at least one adjacent LED segment is increased.

2. The method of claim 1, wherein the secondary luminance value of the at least one adjacent LED segment is increased in step (c)(i) until the luminance ratio equals the predefined threshold ratio.

3. The method of claim 1, wherein the predefined threshold ratio is at least 3% and less than 5%.

4. The method of claim 1, wherein the predefined threshold ratio is 4%.

5. The method of claim 1, wherein the segmented LED array includes a phosphor layer and a sapphire layer.

6. The method of claim 1, wherein the segmented LED array is a 2×1 LED array.

7. The method of claim 1, wherein the segmented LED array is a 3×3 LED array.

8. The method of claim 1, wherein the at least one adjacent LED segment includes at least one directly adjacent LED segment and at least one diagonally adjacent LED segment, and the secondary luminance value of the at least one diagonally adjacent LED segment is 40-60% of the secondary luminance value of the at least one directly adjacent LED segment.

9. The method of claim 1, wherein an adaptive flash process is performed during step (a).

\* \* \* \* \*